(12) United States Patent
Yoffe (10) Patent No.: US 11,855,416 B2
(45) Date of Patent: Dec. 26, 2023

(54) EXTERNAL-CAVITY LASER WITH REDUCED FREQUENCY NOISE

(71) Applicant: Gideon Yoffe, Stanford, CA (US)

(72) Inventor: Gideon Yoffe, Stanford, CA (US)

(73) Assignee: Fiber Sense Limited, Mosman (AU)

( * ) Notice: Subject to any disclaimer, the term of this patent is extended or adjusted under 35 U.S.C. 154(b) by 181 days.

(21) Appl. No.: 17/243,326

(22) Filed: Apr. 28, 2021

(65) Prior Publication Data

US 2021/0336416 A1 Oct. 28, 2021

Related U.S. Application Data

(60) Provisional application No. 63/016,921, filed on Apr. 28, 2020.

(51) Int. Cl.

| | | |
|---|---|---|
| H01S 3/08 | (2023.01) | |
| H01S 5/50 | (2006.01) | |
| H01S 5/0683 | (2006.01) | |
| H01S 5/06 | (2006.01) | |
| H01S 5/14 | (2006.01) | |
| H01S 5/02 | (2006.01) | |
| H01S 5/068 | (2006.01) | |
| H01S 5/00 | (2006.01) | |
| G02F 1/225 | (2006.01) | |
| G02F 1/21 | (2006.01) | |

(52) U.S. Cl.
CPC .......... *H01S 5/5045* (2013.01); *H01S 5/0078* (2013.01); *H01S 5/021* (2013.01); *H01S 5/0612* (2013.01); *H01S 5/0683* (2013.01); *H01S 5/06817* (2013.01); *H01S 5/14* (2013.01); *H01S 5/141* (2013.01); *H01S 5/142* (2013.01); *G02F 1/212* (2021.01); *G02F 1/225* (2013.01); *G02F 2203/50* (2013.01); *H01S 5/06821* (2013.01)

(58) Field of Classification Search
CPC ...... H01S 5/5045; H01S 5/0078; H01S 5/021; H01S 5/0612; H01S 5/06817; H01S 5/0683; H01S 5/14; H01S 5/141; H01S 5/142
See application file for complete search history.

(56) References Cited

U.S. PATENT DOCUMENTS

| | | |
|---|---|---|
| 8,804,787 B1 | 8/2014 | Coleman et al. |
| 8,867,579 B2 | 10/2014 | Goobar et al. |
| 2003/0026532 A1* | 2/2003 | Murry ............... G01J 9/00 385/27 |
| 2005/0169342 A1 | 8/2005 | Glew et al. |
| 2006/0159135 A1 | 7/2006 | Cliche et al. |
| 2006/0198401 A1* | 9/2006 | Suzuki ............... H01S 5/142 372/29.016 |

(Continued)

OTHER PUBLICATIONS

International Search Report on related PCT Application No. PCT/IB2021/053549 from International Searching Authority (KIPO) dated Jul. 28, 2021.

(Continued)

*Primary Examiner* — Kinam Park
(74) *Attorney, Agent, or Firm* — KOS IP Law LLP (57) ABSTRACT

A laser for a distributed fiber sensing system may have a frequency discriminator integrated with the laser. The laser may be an external cavity laser, with at least a portion of the laser cavity on a planar lightwave circuit, which also includes the frequency discriminator.

13 Claims, 11 Drawing Sheets

(56) References Cited

U.S. PATENT DOCUMENTS

| | | | |
|---|---|---|---|
| 2009/0122817 A1* | 5/2009 | Sato | G02B 6/12007 |
| | | | 372/20 |
| 2011/0149365 A1* | 6/2011 | Cho | H01S 5/02438 |
| | | | 359/578 |
| 2011/0158272 A1* | 6/2011 | Pezeshki | H01S 5/4087 |
| | | | 372/38.02 |
| 2012/0195332 A1* | 8/2012 | Yoffe | H01S 5/1032 |
| | | | 372/98 |
| 2013/0215919 A1* | 8/2013 | Aflatouni | H01S 5/12 |
| | | | 372/38.08 |
| 2017/0269303 A1 | 9/2017 | Tan | |
| 2019/0372307 A1 | 12/2019 | Morton | |
| 2020/0025926 A1 | 1/2020 | Asghari et al. | |
| 2020/0280173 A1* | 9/2020 | Gao | H01S 5/142 |

OTHER PUBLICATIONS

Written Opinion on related PCT Application No. PCT/IB2021/053549 from International Searching Authority (KIPO) dated Jul. 28, 2021.

* cited by examiner

EXTERNAL-CAVITY LASER WITH REDUCED FREQUENCY NOISE

CROSS REFERENCE TO RELATED APPLICATION

This application claims the benefit of the filing date of U.S. Provisional Patent Application No. 63/016,921, filed on Apr. 28, 2020, the disclosure of which is incorporated by reference herein.

FIELD OF THE INVENTION

The present invention relates generally to distributed fiber sensing, and more particularly to lasers for distributed acoustic sensing (DAS) systems.

BACKGROUND OF THE INVENTION

Optical distributed fiber sensing (DFS) systems have been used for several decades for the purpose of locating fiber faults or measuring temperature, strain, or vibration. DFS systems are distinguished from those using discrete distributed sensors in that the fiber itself forms an array of sensors. The system relies on optical scattering within the fiber, which can be due to glass inhomogeneities (Rayleigh), acoustic waves (Brillouin) or optical phonons (Raman). In a typical system, light pulses are launched from one end of the fiber and reflected backscatter is received at the launch end. Time-of-flight measurements are used to determine where in the fiber a particular scattering event occurred, and analysis of the received signal is used to evaluate the measurand.

Coherent detection of backscatter is commonly used for distributed vibration sensing (DVS), often known as distributed acoustic sensing (DAS). Any change in strain at a point along the optical fiber will cause a change in the optical path length and hence a change in the phase of the backscattered light.

Figure 1:
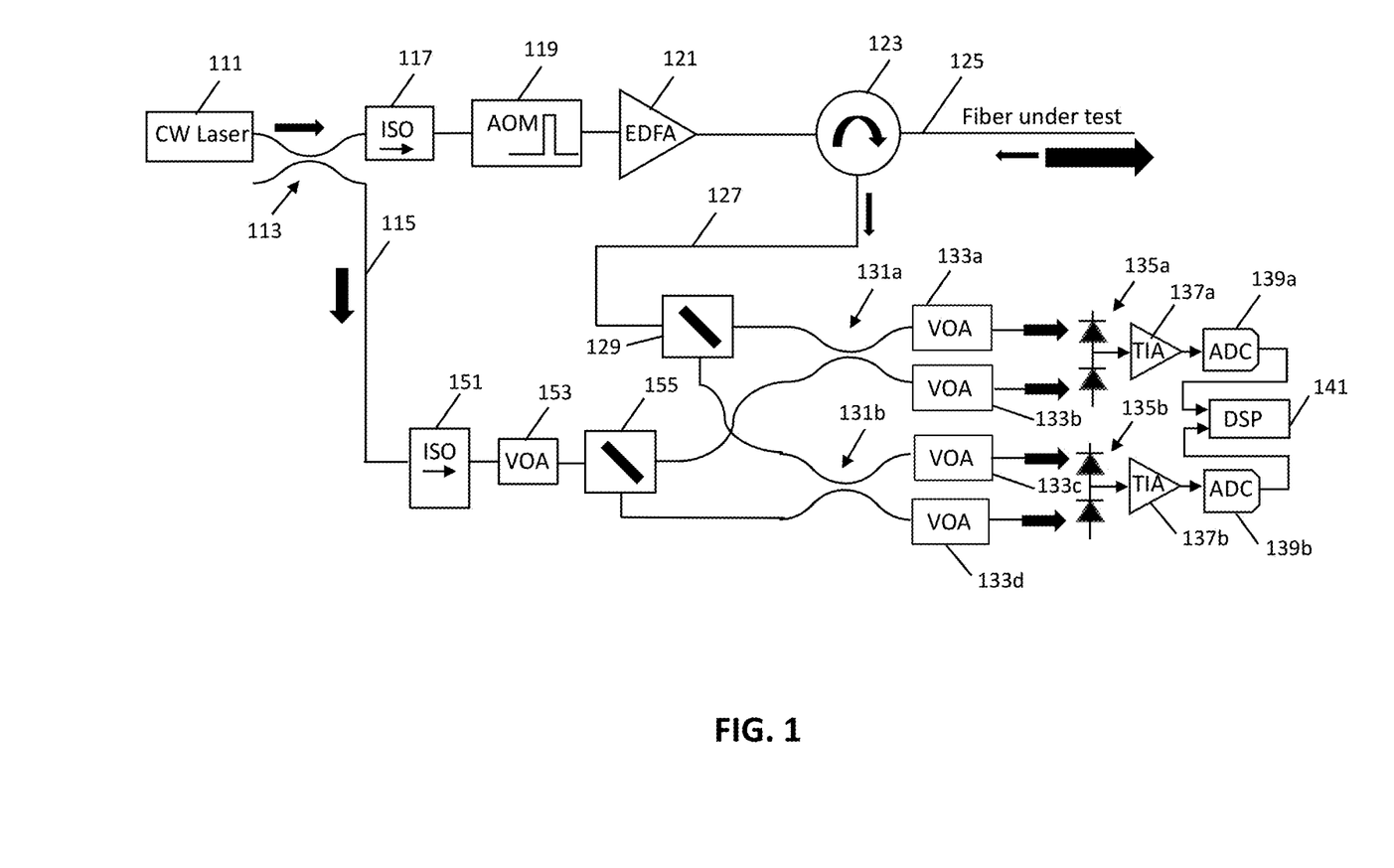
FIG. 1 is a semi-schematic diagram of a typical phase-sensitive DAS system with a heterodyne coherent receiver.

A schematic diagram of a typical phase-sensitive DAS system with a heterodyne coherent receiver is shown in FIG. 1. Light from a continuous wave (CW) laser 111, serving as a source laser and typically operating in the telecommunications band near 1550 nm, is split into two paths, for example by a splitter 113. A first path passes through an optical isolator 117, and is formed into optical pulses, typically 10's to 100's of ns long, by an acousto-optic modulator (AOM) 119. The AOM also shifts the optical frequency of the light, typically by 80 to 300 MHz. The pulses are amplified by an Erbium-doped fiber amplifier (EDFA) 121 and launched into a fiber-under-test 125 via an optical circulator 123. The backscattered light from the fiber under test is directed by the circulator to a signal input of a coherent receiver. A second path 115 from the CW laser forms the local oscillator (LO) input to the coherent receiver. Light in the second path is passed through an optical isolator 151 and a variable optical attenuator 153. The polarization of the backscattered optical signal may well be different from that of the transmitted light, since the fiber-under-test may be several 10's of km in length, so polarization diversity is generally required in the receiver. The signal and LO light are split into paths for the two polarizations by polarization beam splitters 129 and 155, respectively, and mixed in 3 dB optical couplers 131a,b. The outputs of the couplers are passed through variable optical attenuators 133a-d, and are taken to balanced photodetectors 135a,b. Electrical outputs of the photodetectors are amplified by transimpedance amplifiers (TIAs) 137a,b, converted to digital signals by analog-to-digital converters (ADCs) 139a,b and analyzed by digital signal processors (DSP) 141. The optical frequencies of the signal and LO differ by the AOM frequency. The vibration frequencies of interest are in the range 0 to tens of kHz, so the full phase information in the signal can be measured electrically.

The sensitivity of a DAS system depends on the various noise sources, one of the most important being the frequency noise or phase noise of the laser. Since the purpose of the system is to measure relatively slow phase fluctuations, from zero frequency up to tens of kHz, for a DAS system it is generally preferred that the laser source exhibit low frequency noise in this range.

Two distinct types of lasers are commonly used as sources in DAS systems:
  i. Fiber lasers, in which doped optical fiber is used for light generation and amplification, with some means of optical feedback such as fiber Bragg gratings.
  ii. External-cavity semiconductor lasers (ECL), in which an extended optical cavity is formed in free space, optical fiber, or a planar lightwave circuit (PLC).

In both types of lasers, the design of the long optical cavity provides substantial reduction in frequency noise compared to a single-frequency semiconductor laser such as a distributed feedback (DFB) laser. A convenient metric for frequency noise is the optical linewidth, which is closely related to the high-frequency part of the frequency noise spectrum. The linewidth of a DFB laser is typically in the range 0.5 to 5 MHz, while the linewidth of a fiber laser or ECL for DAS systems is typically 0.1 to 10 kHz.

Figure 2:
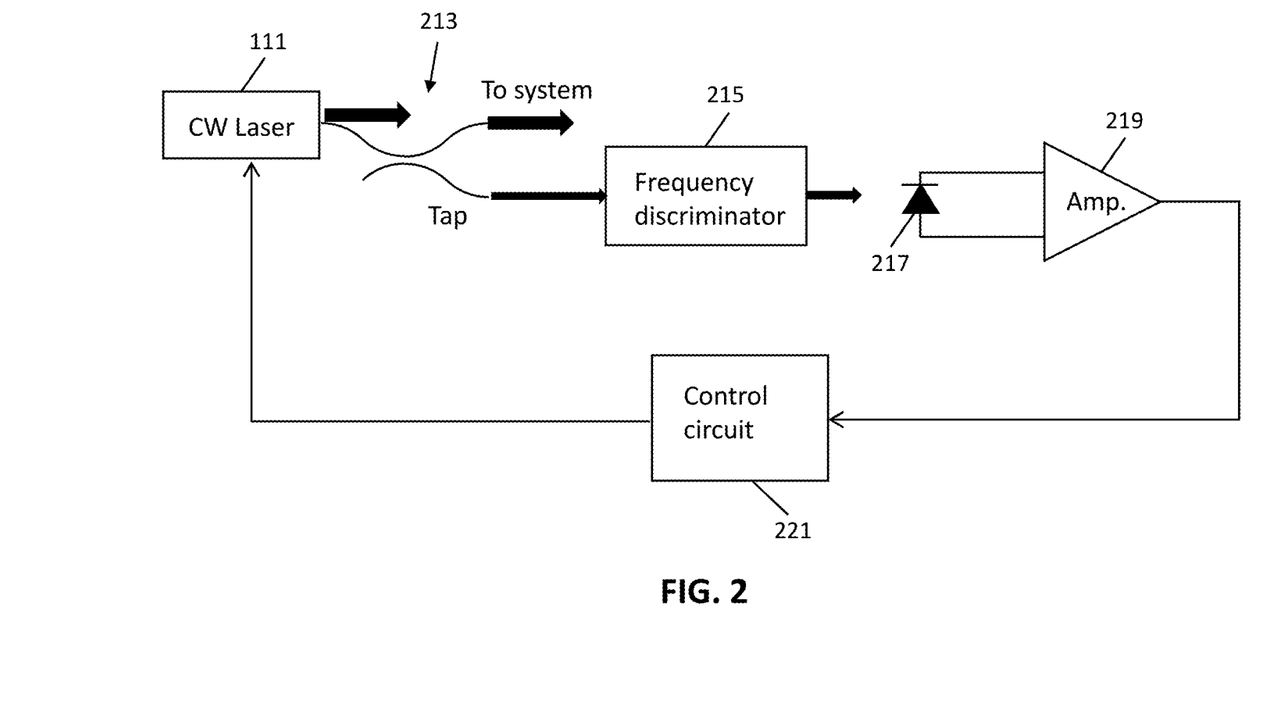
FIG. 2 is a semi-schematic diagram showing a noise reduction technique for a laser.
Figure 3:
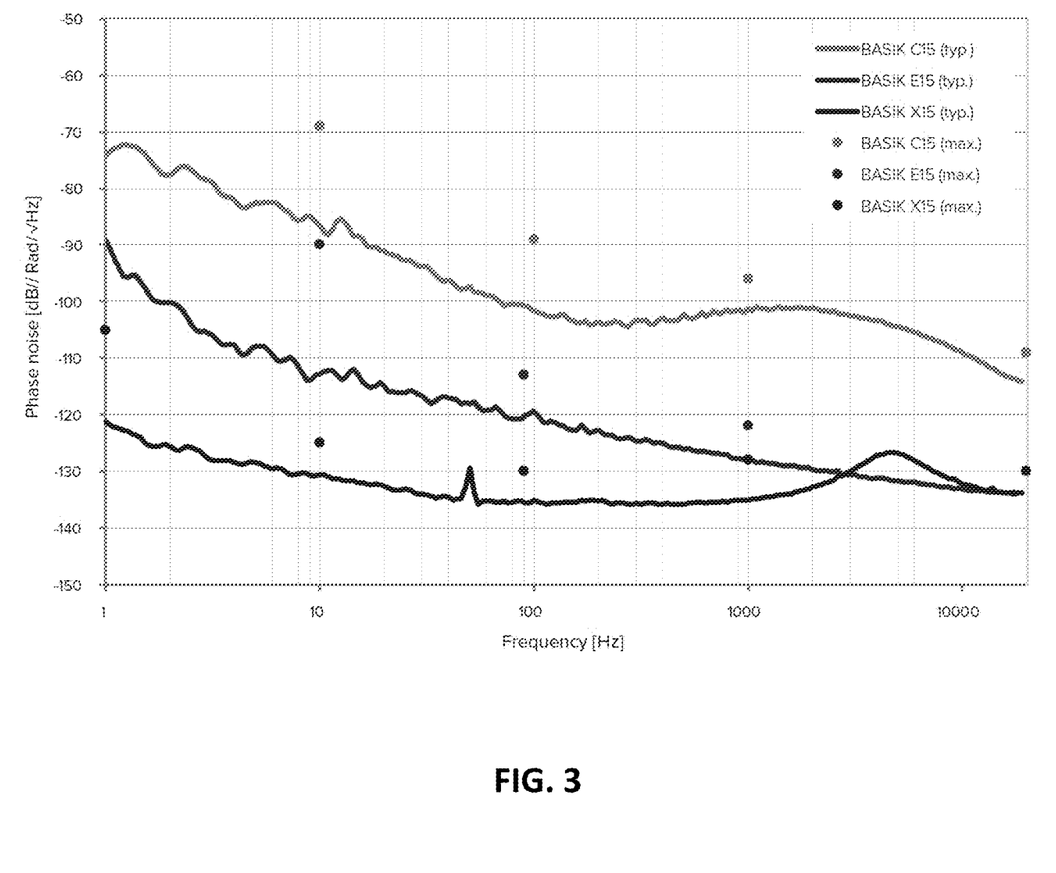
FIG. 3 is a graph showing frequency noise spectra from fiber lasers.

It is possible to reduce the frequency noise of a laser by use a feedback technique, as illustrated in FIG. 2, which is a semi-schematic showing a noise reduction technique for a laser. In FIG. 2, part of optical output of a continuous wave laser 111 is tapped off by a tap 213 and taken to a frequency discriminator 215, which converts frequency or wavelength fluctuations into optical power fluctuations. Typical examples of frequency discriminators are Fabry-Perot interferometers and Mach-Zehnder interferometers with unequal arm lengths. The optical output of the discriminator falls on a photodetector 219, whose electrical output is amplified by an amplifier 219, forming an electrical measurement of the frequency noise. A feedback loop with a control circuit 221 provides a signal to an actuator (not shown in FIG. 2) within the laser that counteracts frequency (or wavelength) deviations. This technique is well-known. FIG. 3 is a graph showing frequency noise spectra from fiber lasers manufactured by NKT Photonics, taken from a datasheet available at nktphotonics.com. Models E15 and X15 have essentially the same laser cavity, and the Model X15 contains a feedback loop to lower the low-frequency frequency noise.

BRIEF SUMMARY OF THE INVENTION

Some embodiments provide a frequency discriminator integrated onto a PLC. In some embodiments the frequency discriminator is to provide a feedback signal to lower frequency noise of a semiconductor laser. In some embodiments the semiconductor laser and the frequency discriminator are part of a DAS system. In some embodiments a fast thermal tuning element is used as an actuator in an electrical feedback loop. The thermal tuning element can be an integrated resistor or a dummy diode. In some embodiments a trench can be etched on a side of the thermal tuning element opposite a side adjacent a waveguide to improve thermal efficiency. In some embodiments the laser includes a reflective semiconductor optical amplifier (RSOA), and a phase modulator is integrated with the RSOA as the actuator in the electrical feedback loop. In some embodiments a fast thermal tuning element or phase modulator is integrated on the external cavity as the actuator in the feedback loop. In some embodiments the frequency discriminator is integrated with an optical feedback element in a laser cavity. In some embodiments the frequency discriminator is integrated with the RSOA. In some embodiments a grating, or gratings, are fabricated in a waveguide by forming perturbations in a width of the waveguide or by patterning islands of waveguide material to one or both sides of the waveguide. In some embodiments the width perturbations or islands are placed on alternating fashion along a length of sides of the waveguide. In some embodiments an optical feedback element includes a PLC that contains at least one ring resonator coupled to at least one Bragg grating.

Some embodiments provide a laser device with a frequency discriminator for a distributed fiber sensing system, comprising: a laser element for generating light; and a planar lightwave circuit (PLC) optically coupled to the laser element so as to receive light from the laser element, the PLC including a frequency discriminator component.

In some embodiments the frequency discriminator component comprises a Mach-Zehnder interferometer with asymmetric arm lengths and a phase shifter in at least one arm.

In some embodiments the laser element is part of an external cavity laser, and the PLC includes a wavelength selective component optically coupled to the laser element, so as to provide wavelength selective feedback to the laser element.

In some embodiments the laser element comprises a reflective semiconductor optical amplifier (RSOA). In some such embodiments the wavelength selective component comprises a Bragg grating. In some such embodiments the frequency discriminator component comprises a Mach-Zehnder interferometer with asymmetric arm lengths and a phase shifter in at least one arm. In some such embodiments the Mach-Zehnder interferometer is optically coupled to a portion of a waveguide including the Bragg grating, with the Bragg grating being optically between the RSOA and the Mach-Zehnder-interferometer.

In some embodiments the wavelength selective component comprises a waveguide with perturbations along at least part of a length of the waveguide. In some such embodiments the perturbations along at least part of the length of the waveguide alternate from one side of the waveguide to another side of the waveguide along the at least part of the length of the waveguide.

In some embodiments the wavelength selective component comprises a waveguide with islands of waveguide material on at least one side of the waveguide along at least part of a length of the waveguide. In some such embodiments the islands of waveguide material alternate from one side to another side of the waveguide along the at least part of the length of the waveguide.

In some embodiments the wavelength selective component comprises a ring resonator and a Bragg grating in series. In some such embodiments the Bragg grating is coupled to a drop waveguide of the ring resonator. In some such embodiments an output of the Bragg grating provides an optical output of the laser device. Some such embodiments further comprise a heater for the ring resonator to modify a transmission resonance of the ring resonator.

Some of any of the previously discussed embodiments further comprise an integrated heater adjacent the laser element, the integrated heater adjustable based on signals from the frequency discriminator. Some such embodiments further comprise an etched trench positioned on a side of the heater away from the laser element.

Some of any of the previously discussed embodiments further comprise a phase modulator integrated with the laser element, the phase modulator adjustable based on signals from the frequency discriminator.

In some of any of the previously discussed embodiments an output signal of the frequency discriminator is coupled to a digital signal processor (DSP) of the distributed fiber sensing system. In some such embodiments the output signal is for use by the DSP in correcting for wavelength fluctuations in light from the laser element.

These and other aspects of the invention are more fully comprehended upon review of this disclosure.

DETAILED DESCRIPTION

Some aspects of this invention relate to techniques to improve low-frequency noise characteristics of an external-cavity semiconductor laser, in some embodiments of a DAS system. In some embodiments, frequency noise of an external-cavity semiconductor laser is reduced using a feedback loop. In some embodiments a DAS system includes the external cavity semiconductor laser whose frequency noise is reduced. In some embodiments a frequency discriminator is fabricated in a PLC. Various embodiments for an actuator in the feedback loop, and various options for integration of multiple functions on a single substrate are also discussed below.

Figure 4:
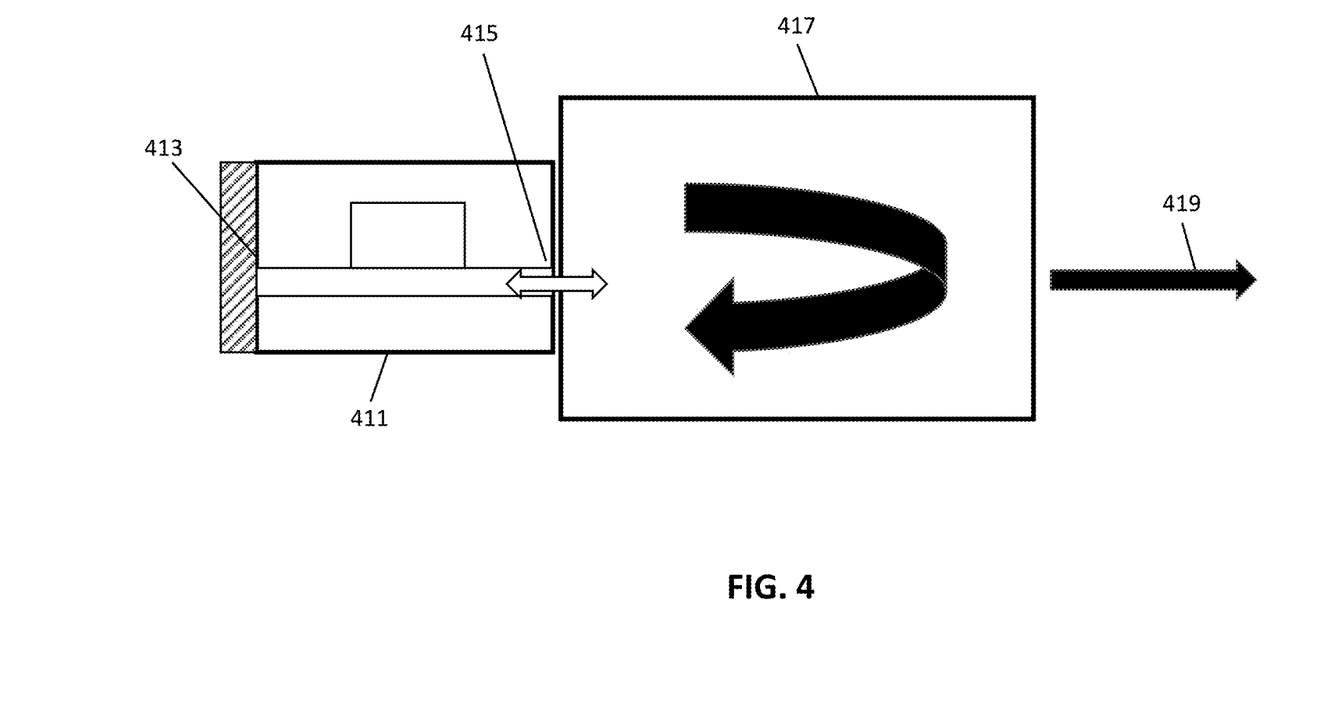
FIG. 4 is a semi-schematic diagram of an external-cavity semiconductor laser that may be used as a source for DFS systems.

FIG. 4 is a semi-schematic diagram of an external-cavity semiconductor laser that may be used as a source for DFS systems in some embodiments. Such lasers may take many forms, and this description is very general. In some embodiments, and as shown in FIG. 4, a reflective semiconductor optical amplifier (RSOA) 411 is used to generate and amplify light. A rear facet 413 of the RSOA is coated to create a reflecting mirror. A front facet 415 is anti-reflection coated, and light is coupled from this facet into an external optical system 417 that provides wavelength-selective feedback to the RSOA. The external optical system also provides an optical output 419 for the laser. Alternative geometries are possible, for example with external wavelength-selective feedback at the rear facet, instead of or in addition to wavelength-selective feedback into the front facet. The wavelength-selective feedback can be created in many ways, using for example, in various embodiments, optical filters coupled in free space, optical fiber Bragg gratings, PLC's that contain gratings or ring-resonator circuits, or a Bragg grating etched in a silica planar waveguide.

Figure 5:
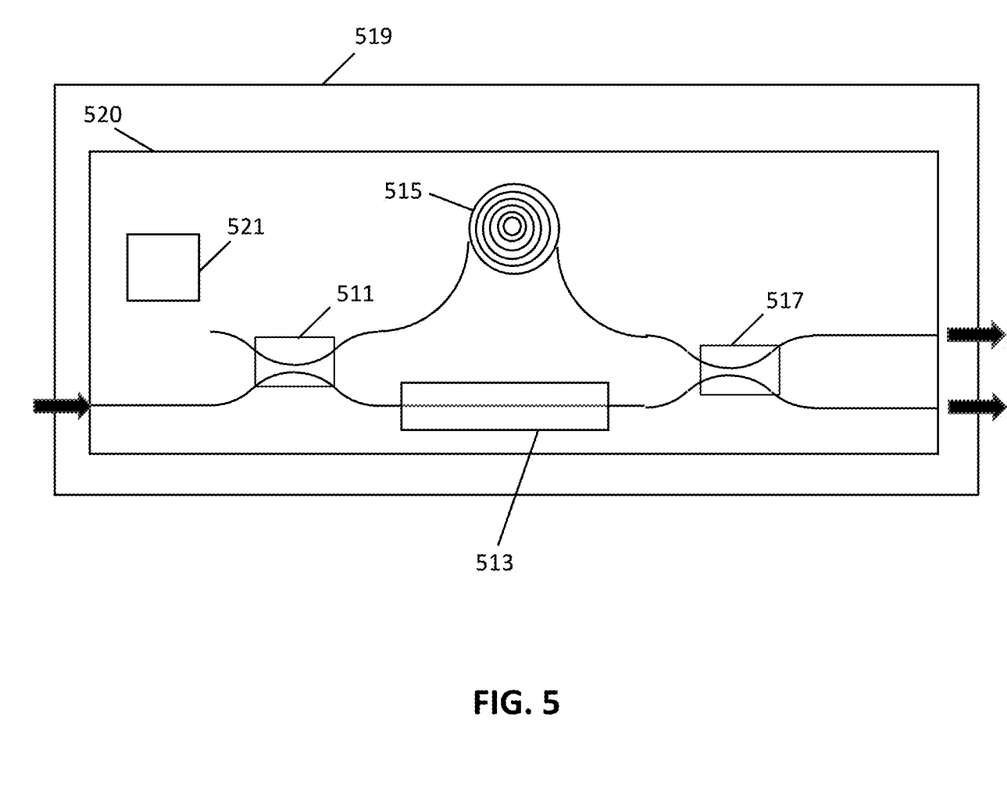
FIG. 5 is a semi-schematic of a planar lightwave circuit (PLC) frequency discriminator for use with a source laser for DAS system.

An embodiment of a planar lightwave circuit (PLC) frequency discriminator for use with a source laser for DAS system is illustrated semi-schematically in FIG. 5. The PLC frequency discriminator may receive light from the external-cavity semiconductor laser of FIG. 4, for example. The PLC frequency discriminator contains a Mach-Zehnder interferometer with a waveguide delay line 515 in one arm. In FIG. 5, the Mach-Zehnder interferometer is shown as having a signal input split into two arms by a first 3 dB coupling 511, with two outputs from a second 3 dB coupling 517 at the end of the arms. The two outputs from the second 3 dB coupling may be provided to photodetectors (not shown in FIG. 5), with outputs of photodetectors used as an electrical output signal of the frequency discriminator. The asymmetry due to the delay line creates a transmission spectrum roughly periodic in wavelength. A phase shifter 513 in one arm, typically a heater, allows precise tuning of the interferometer to the wavelength of the laser. In some embodiments, and as shown in FIG. 5, the heater is for the arm other than the delay line. In order to stabilize the discriminator, the PLC 520 may be mounted on a thermo-electric cooler (TEC) 519 that is controlled using a temperature-sensitive element such as a thermistor 521, for example mounted to the PLC. The PLC is fabricated in a waveguide platform such as Silica, Silicon, or Silicon Nitride, all of which offer low optical loss. The optical delay line may be designed as a spiral, and may provide a delay of more than one nanosecond which creates strong discrimination. For example, an implementation in Silicon Nitride, with a 5 ns delay in one arm, gives a wavelength spacing between transmission peaks of about 1.5 picometers for a laser operating at a wavelength of 1550 nanometers. The signal from the discriminator may be used to provide feedback to some actuator in the external-cavity laser that acts counter to the measured change in laser wavelength. The basic mechanism is an adjustment of the optical length of the optical cavity, either through a change in the physical length or through a change in the refractive index of one or more components. In some embodiments the output signal from the frequency discriminator is provided to, or used in providing a signal to a digital signal processor (DSP), for example the DSP of the DAS system of FIG. 1. In such embodiments, the DSP may use the signal in determining and/or accounting for wavelength fluctuations in light generated by the laser. In some such embodiments output of the frequency discriminator may be used by the DSP to correct for wavelength fluctuations in the laser, instead of or in addition to the output of the frequency discriminator being used to provide feedback to an actuator of the laser.

In some embodiments feedback is through adjusting drive current to the RSOA. A change of current causes a change in the refractive index of the RSOA and hence alters the optical length of the cavity. This approach has drawbacks because of the two different and opposite mechanisms that cause a change of refractive index. Considering an increase in the drive current, there will be an increase in the number of electrical carriers in the semiconductor junction that causes a reduction in the refractive index on a time scale in the nanosecond range. The increase in electrical drive will also cause heating, which increases the refractive index with several time constants, some below 1 millisecond, others greater than 1 second. Thus, the control circuitry may be complex. Another disadvantage is that the change in current inevitably causes a change of optical intensity, so this mechanism may increase the intensity noise.

Figure 6:
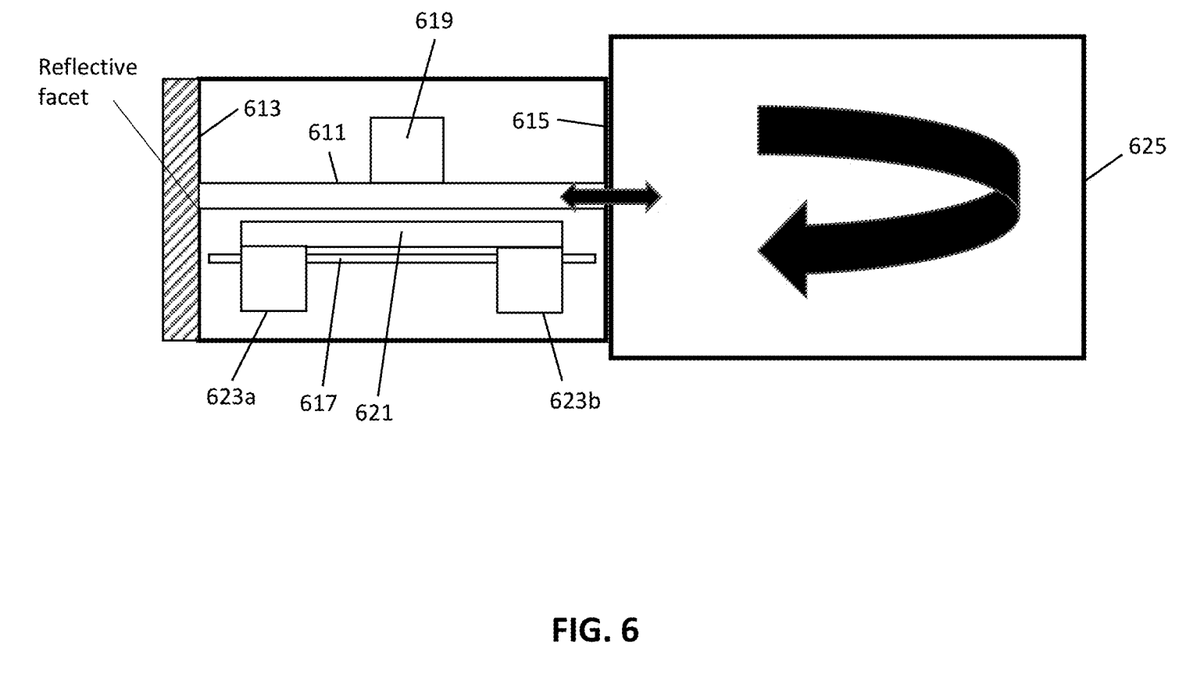
FIG. 6 is a semi-schematic diagram of a reflective optical semiconductor amplifier (RSOA) with an integrated heater for frequency tuning.

Some embodiments have a separate heater on the RSOA chip that can change the temperature of the RSOA and thereby changing the refractive index of the RSOA, without changing the drive current, thereby mitigating some of the drawbacks mentioned above. This heater can be placed adjacent to the waveguide, or even on top of the waveguide for most efficient heat coupling. The general scheme is illustrated in FIG. 6, which is a semi-schematic diagram of a ROSA with an integrated heater for frequency tuning. As with FIG. 4, a RSOA 611 has a rear reflective facet 613 and a front anti-reflection coated facet 615. The RSOA has an electrical contact 619 for providing drive current to the RSOA. Optical output of the RSOA is provided to an external wavelength selective feedback device 625, with the external wavelength selective feedback device providing an optical output of the laser. The heater is adjacent a waveguide of the RSOA for thermal tuning of the RSOA, with the heater having first and second electrical contacts 623*a,b*. The heater may be, for example, a resistor or diode. A convenient way to integrate a heater adjacent to the waveguide with no additional fabrication steps is to add a dummy active waveguide section and use it as the actuator, a heater in this case. The close thermal coupling of the heater to the active waveguide allows response in the sub-millisecond time scale. If the heater is placed next to the active waveguide, in some embodiments thermal efficiency can be improved by etching a trench 617 on the side of the heater that is not adjacent to the waveguide. As the RSOA is typically much smaller than the external-cavity PLC, the thermal response is therefore faster for the RSOA. Thus, it is possible to counter higher-speed fluctuations more easily by controlling the temperature of the RSOA than by controlling the temperature of the PLC.

Figure 7:
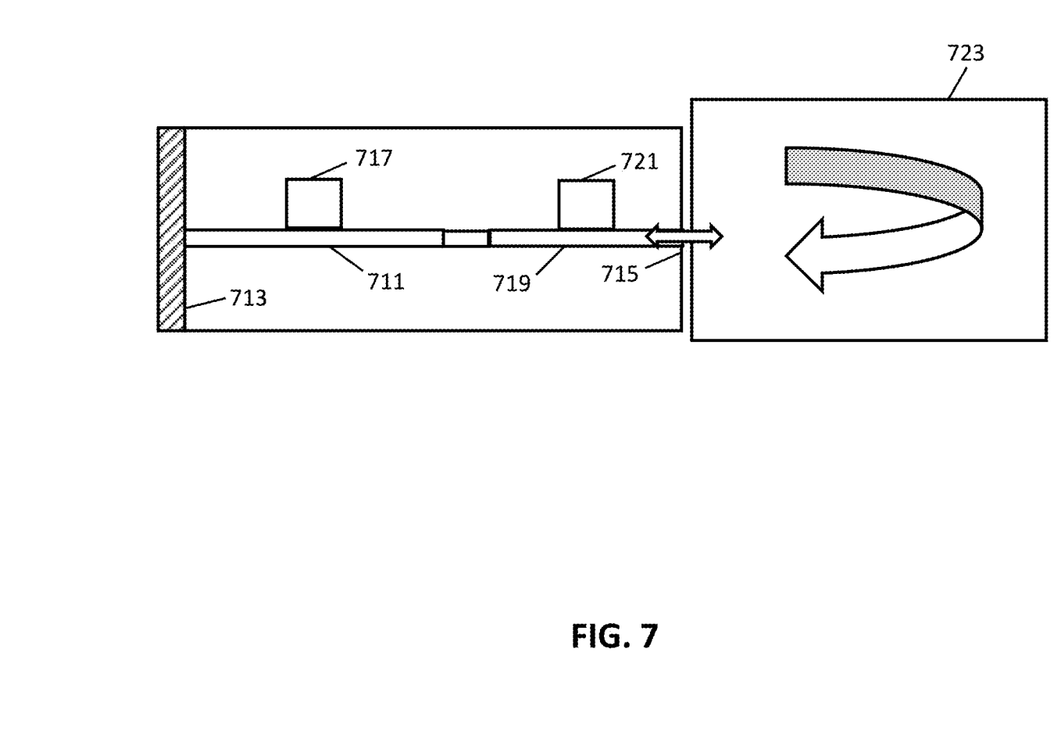
FIG. 7 is a semi-schematic diagram of a RSOA with an integrated phase modulator for frequency tuning.

In some embodiments a phase modulator is integrated on the RSOA chip, for example as illustrated in FIG. 7. Again, as with FIG. 4, a RSOA 711 has a rear reflective facet 713 and a front anti-reflection coated facet 715. The RSOA has an electrical contact 717 for providing drive current to the RSOA. Optical output of the RSOA is provided to an external wavelength selective feedback device 723, which also provides an optical output of the laser. A phase modulator 719 is integrated into a front of the RSOA, with the phase modulator having an electrical contact 721 for application of control signals. The modulator is a section of waveguide whose refractive index can be adjusted electrically, either by forward bias or by reverse bias. The modulator section can be placed toward the front facet, as shown in FIG. 7, or at the rear facet. There are several physical effects that can convert electrical signal to a refractive index change, and this document will refer to them together as electro-optic effects. Such phase modulators are commonly used in semiconductor Mach-Zehnder modulators and monolithic tunable semiconductor lasers. Usually, the waveguide core of the modulator is formed of semiconductor layers of different composition from those in the amplifier section in order to minimize the absorption loss. The optical waveguide is essentially continuous through the whole chip.

The integrated chip is typically designed so that the amplifier and modulator sections are electrically isolated by a high resistance. Such electro-optic effects are generally much faster than thermal effects, and therefore allow compensation of wavelength fluctuations up to higher frequency.

In some embodiments the actuator is built into the external cavity component. In addition to the thermal and electro-optic mechanisms, rapid mechanical movement through a piezo-electric actuator can be used to alter the optical cavity length and hence tune the wavelength.

Figure 8:
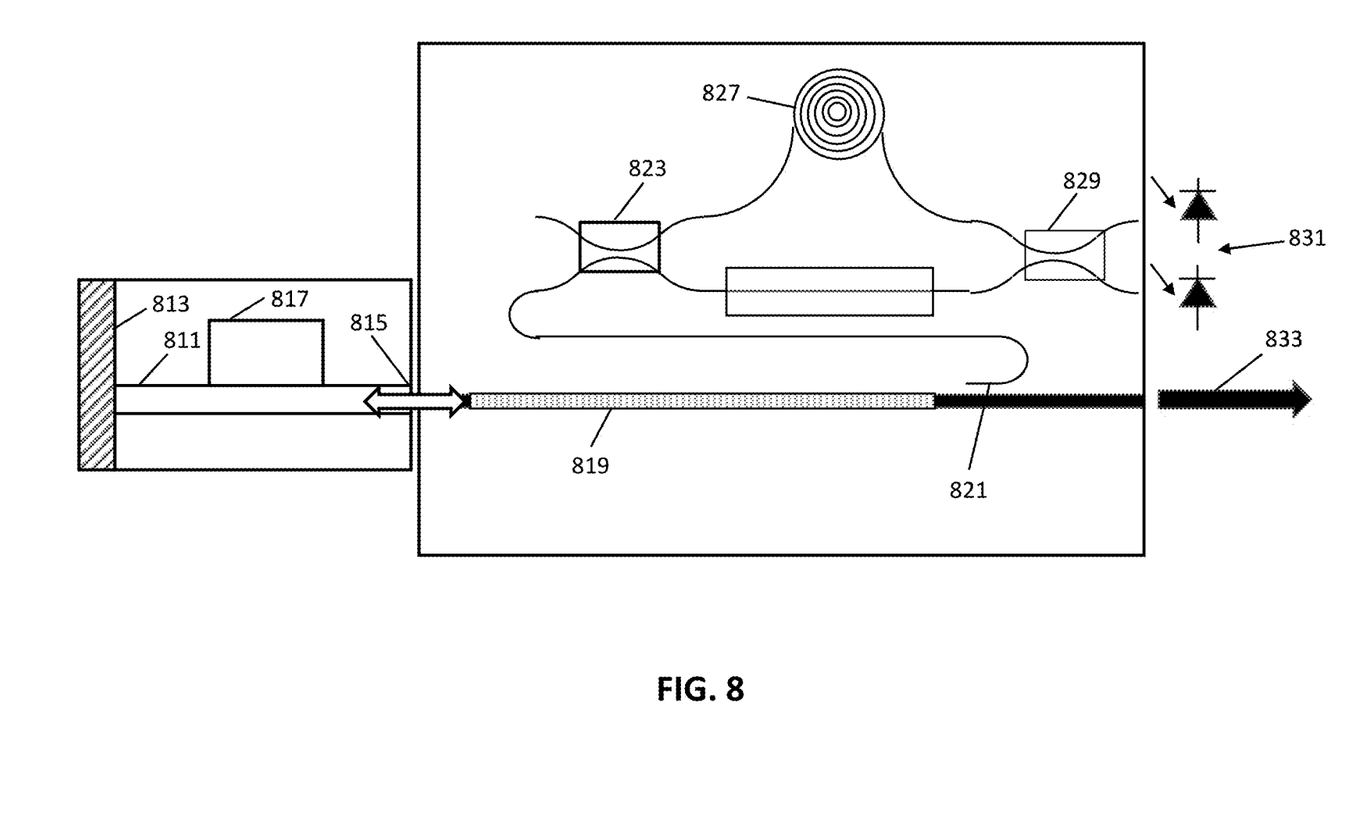
FIG. 8 is a semi-schematic diagram of a RSOA with a frequency discriminator integrated with an optical feedback element.

In some embodiments the frequency discriminator function is integrated in the same PLC that provides wavelength-selective feedback. Such integration may allow for a reduction in size and cost of the laser. One example arrangement is shown in FIG. 8. In FIG. 8, a RSOA 811 is shown as being butt-coupled to a PLC. The RSOA has a reflective rear facet 813 and an anti-reflection coated front facet 815. Wavelength selective feedback is provided by a Bragg grating 819 in a waveguide of the PLC. The same concept could equally be applied if the wavelength-selective feedback is provided by ring resonators or other components. FIG. 8 also shows the PLC as including a frequency discriminator, in the form of a Mach-Zehnder interferometer. An optical tap 821 past the Bragg grating takes some of the light from the waveguide, and provides the light to two arms of the Mach-Zehnder interferometer by way of a first 3 dB coupling 823. A second 3 dB coupling 829 mixes light at the end of the two arms, with two outputs from the second 3 dB provided to photodetectors 831. Outputs of the photodetectors may be used as an electrical output signal of the frequency discriminator. A waveguide delay line 827 is in one arm, with a heater as a phase shifter 825 in another arm. In some embodiments, the frequency discriminator function can instead be integrated on the RSOA rather than integrated with the external cavity. The signal from the discriminator may be used to provide feedback to an actuator in the external-cavity laser that acts counter to the measured change in laser wavelength. In addition, as with the embodiment of FIG. 5, in some embodiments the output signal from the frequency discriminator is provided to, or used in providing a signal to a digital signal processor (DSP), for example the DSP of the DAS system of FIG. 1. In such embodiments, the DSP may use the signal in determining and/or accounting for wavelength fluctuations in light generated by the laser. In some such embodiments output of the frequency discriminator may be used by the DSP to correct for wavelength fluctuations in the laser, instead of or in addition to the output of the frequency discriminator being used to provide feedback to an actuator of the laser.

Figure 9A:
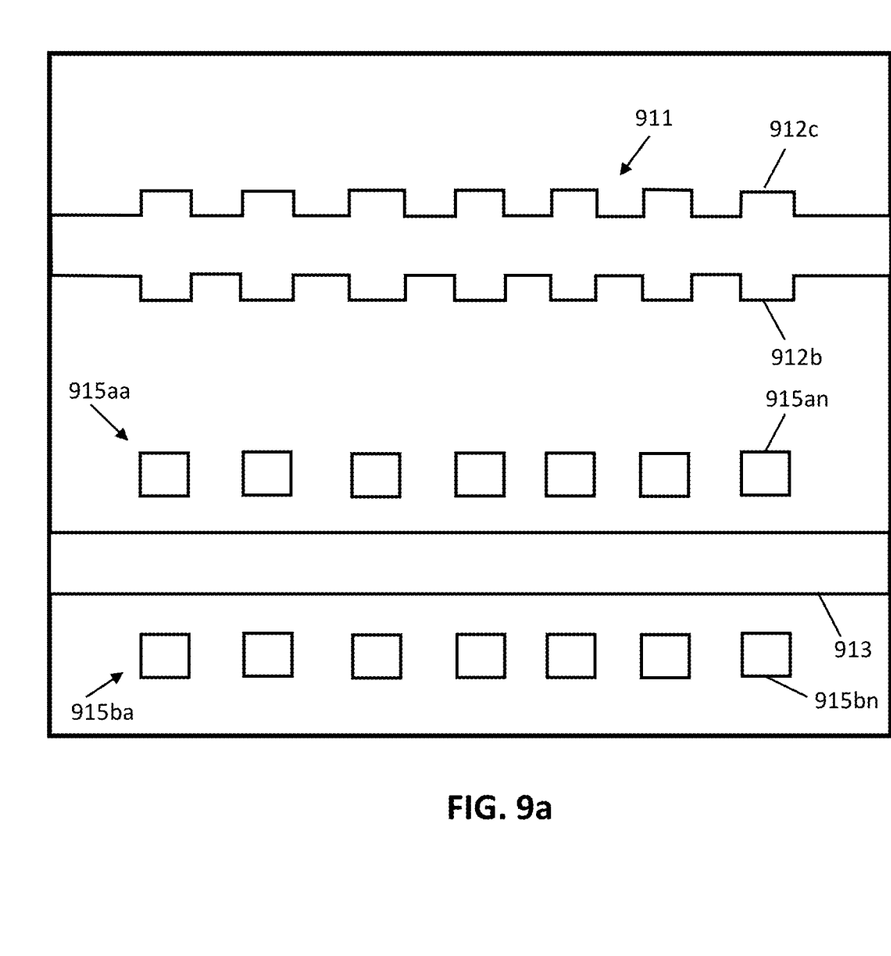
FIG. 9a shows top views of two example waveguides with etched gratings.

In some embodiments, the feedback and optional frequency discriminator are fabricated in a material platform with higher contrast in refractive index than is offered by conventional silica waveguides. An example of a high-contrast platform is Silicon Nitride waveguides with Silicon Dioxide cladding. In such platforms, a grating can conveniently be fabricated by varying lateral dimensions of the waveguide. This form of grating can be fabricated in the same lithography step as the waveguide itself. Examples of schematic top views of such gratings are shown in FIG. 9a. FIG. 9a shows a first example waveguide 911 in which the grating is formed by perturbations in width of the waveguide along a length of the waveguide. In FIG. 9a, for the first example waveguide, width of the waveguide is increased periodically by opposing perturbations on sides of the waveguide, for example as illustrated by perturbations 912a,b. FIG. 9a also shows a second example waveguide 913, in which the grating is formed by the presence of small islands 915aa-an, 915ba-bn of waveguide material to the side of the waveguide. These perturbations or islands can be placed on both sides, as shown in FIG. 9a, or on only one side.

Figure 9B:
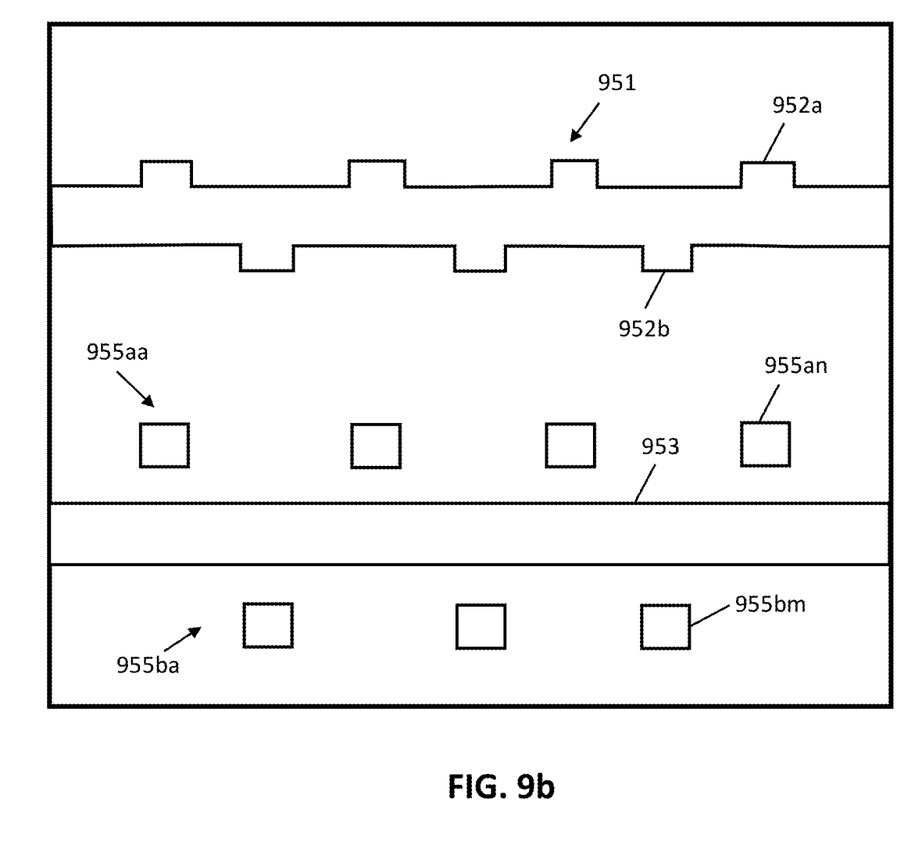
FIG. 9b shows top views of two alternative example waveguides with etched gratings.

In some wafer foundries it may be difficult to fabricate such structures using conventional optical lithography because of the small size of the features and the small spacing between the features. This difficulty can be alleviated by placing the width perturbations or islands on alternating sides of the waveguide. FIG. 9b shows two alternative waveguides, similar to those of FIG. 9a, but with perturbations or islands alternately spaced along lengths of the waveguides. For a first alternative waveguide 951, width of the waveguide is increased periodically along a length of the waveguide by perturbations which alternate from one side of the waveguide to another side, with for example a perturbation 952a on one side near an end of the waveguide and a perturbation 952 on the other side of the waveguide farther from the end of the waveguide. For a second alternative waveguide 953, islands 955aa-an are on a first side of the waveguide, and islands 955ba-bm are on a second opposing side of the waveguide. The islands on either side of the waveguide are alternately spaced along a length of the waveguide.

Figure 10:
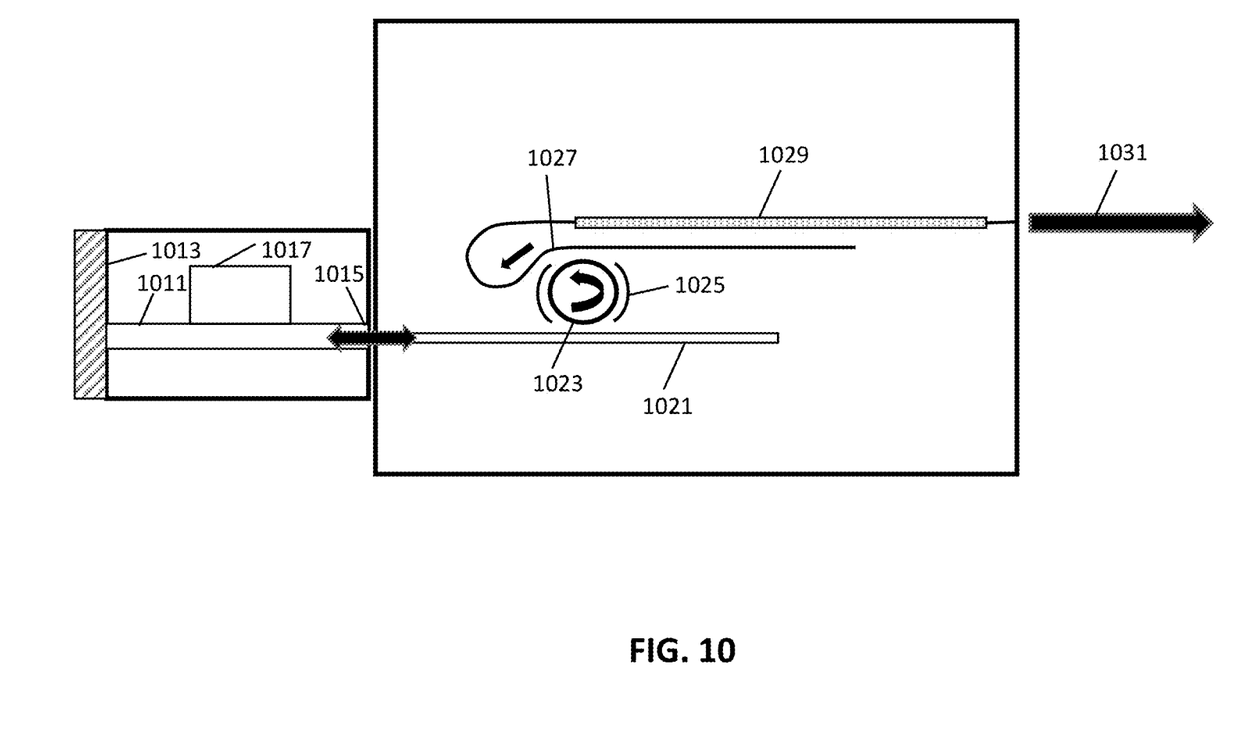
FIG. 10 is a semi-schematic diagram of a RSOA with both a ring resonator and a grating in an external cavity.

In some embodiments, the PLC forming the external cavity contains both at least one ring resonator and at least one grating. Such embodiments may exploit favorable characteristics of both elements. This type of embodiment may allow precise tuning of the operating point of the laser with respect to the reflection spectrum of the grating, and the narrow bandpass filter of the ring resonator helps to suppress side modes that may degrade the laser performance. One example arrangement is illustrated in FIG. 10. In FIG. 10, a RSOA 1011 has a reflective rear facet 1013 and an anti-reflection coated front facet 1015. An electrical contact 1017 provides for drive current to the RSOA. Light is coupled from the RSOA chip to a waveguide on a PLC. Light in the waveguide couples to a ring resonator 1031 on the PLC. Some of the light remains in a "through" waveguide 1021. For certain wavelengths of light, a significant fraction of the power in a finite wavelength band is coupled to a "drop" waveguide 1027. The optical power spectrum of the light coupled to the "drop" waveguide contains several peaks of high transmission separated by wavelength bands of low transmission. The light in the "drop" waveguide then travels along the waveguide to a Bragg grating 1029 that is formed in the waveguide. The transmission spectrum of the ring resonator can be tuned by a mechanism that changes the refractive index or length of the waveguide. In the example of FIG. 10, a heater 1025 for the ring resonator is used to tune the spectrum so that one of the transmission resonances of the ring resonator occurs at a wavelength that is partially reflected by the Bragg grating. The light that is emitted by the RSOA is coupled to and from the grating. An optical output 1031 is again taken from the end of the Bragg grating furthest from the RSOA chip. Alternatively, the optical output can be taken from the reflective facet of the RSOA. In addition, in some embodiments a frequency discriminator can be integrated on the PLC as well. In some embodiments the frequency discriminator may be as previously discussed, for example as discussed with respect to FIG. 5 or FIG. 8. In some embodiments an input to the frequency discriminator may be a tap from an output of the Bragg grating, or a waveguide of the PLC providing the optical output 1031.

All references to the laser have been to external-cavity lasers. The same functionality can be achieved on a single substrate, either built monolithically into an Indium Phosphide wafer, or on a platform such as Silicon photonics with hybrid integration of the RSOA.

Although the invention has been discussed with respect to various embodiments, it should be recognized that the invention comprises the novel and non-obvious claims supported by this disclosure.

The invention claimed is:

1. A laser device with a frequency discriminator for a distributed fiber sensing system, comprising:
   a laser element for generating light and a planar lightwave circuit (PLC) optically coupled to the laser element so as to receive light from the laser element, the PLC including a frequency discriminator component; wherein the frequency discriminator component comprises a Mach-Zehnder interferometer with asymmetric arm lengths and a phase shifter in at least one arm of the Mach-Zehnder interferometer; and
   wherein the laser element is part of an external cavity laser, and the PLC includes a wavelength selective component optically coupled to the laser element, so as to provide wavelength selective feedback to the laser element.

2. The laser device of claim 1, wherein the laser element comprises a reflective semiconductor optical amplifier (RSOA).

3. The laser device of claim 2, wherein the wavelength selective component comprises a Bragg grating.

4. The laser device of claim 3, wherein the Mach-Zehnder interferometer is optically coupled to a portion of a waveguide including the Bragg grating, with the Bragg grating being optically between the RSOA and the Mach-Zehnder interferometer.

5. A laser device with a frequency discriminator for a distributed fiber sensing system, comprising:
   a laser element for generating light; and
   a planar lightwave circuit (PLC) optically coupled to the laser element so as to receive light from the laser element, the PLC including a frequency discriminator component;
   wherein the laser element is part of an external cavity laser, and the PLC includes a wavelength selective component optically coupled to the laser element, so as to provide wavelength selective feedback to the laser element; and
   wherein the wavelength selective component comprises a waveguide with perturbations along at least part of a length of the waveguide.

6. The laser device of claim 5, wherein the perturbations along at least part of the length of the waveguide alternate from one side of the waveguide to another side of the waveguide along the at least part of the length of the waveguide.

7. A laser device with a frequency discriminator for a distributed fiber sensing system, comprising:
   a laser element for generating light and a planar lightwave circuit (PLC) optically coupled to the laser element so as to receive light from the laser element, the PLC including a frequency discriminator component;
   wherein the laser element is part of an external cavity laser, and the PLC includes a wavelength selective component optically coupled to the laser element, so as to provide wavelength selective feedback to the laser element; and
   wherein the wavelength selective component comprises a waveguide with islands of waveguide material on at least one side of the waveguide along at least part of a length of the waveguide.

8. The laser device of claim 7, wherein the islands of waveguide material alternate from one side to another side of the waveguide along the at least part of the length of the waveguide.

9. The laser device of claim 1, further comprising an integrated heater adjacent the laser element, the integrated heater adjustable based on signals from the frequency discriminator.

10. The laser device of claim 9, further comprising an etched trench positioned on a side of the heater away from the laser element.

11. The laser device of claim 1, further comprising a phase modulator integrated with the laser element, the phase modulator adjustable based on signals from the frequency discriminator.

12. The laser device of claim 1, wherein an output signal of the frequency discriminator is coupled to a digital signal processor (DSP) of the distributed fiber sensing system.

13. The laser device of claim 12, wherein the output signal is for use by the DSP in correcting for wavelength fluctuations in light from the laser element.

* * * * *